United States Patent
Polnyi

(10) Patent No.: US 7,371,100 B1
(45) Date of Patent: May 13, 2008

(54) FASTENING STRUCTURE FOR INTEGRATED CIRCUIT AND ELECTRICAL CONNECTOR USING SAME

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/702,756

(22) Filed: Feb. 6, 2007

(51) Int. Cl.
    *H01R 13/62* (2006.01)
(52) U.S. Cl. ........................... 439/331; 439/342
(58) Field of Classification Search .......... 439/342, 439/331
    See application file for complete search history.

(56) References Cited

U.S. PATENT DOCUMENTS

| | | | |
|---|---|---|---|
| 6,287,137 B1 * | 9/2001 | Noda et al. | 439/342 |
| 7,252,517 B2 * | 8/2007 | Ju | 439/73 |
| 2005/0186826 A1 * | 8/2005 | Bryant | 439/342 |
| 2006/0199413 A1 * | 9/2006 | Ju | 439/331 |

* cited by examiner

*Primary Examiner*—Tho D. Ta
*Assistant Examiner*—Travis Chambers
(74) *Attorney, Agent, or Firm*—Wei Te Chung

(57) ABSTRACT

An electrical connector comprises a retention frame comprising first and second opposite sides, a load frame comprising first and second elongate members interconnected by a third elongate member, and pivoted to the first end of the retention frame, the load frame extending substantially through the length of the retention frame, a load lever pivotally coupled to the second side of the retention frame wherein the load frame can be positioned in a first position in which the load frame is away from the load lever, and a second position, in which the third member of the load frame is pushed toward the retention frame by the load lever, an insulative housing with a plurality of contacts assembled therein and partially sitting onto the retention frame for receiving the IC package, an IC package assembled on the insulative housing, the first and the second elongate members of the load frame each compliantly and substantially press against a longitudinal side portion of the IC package. This configurable electrical connector has a lower cost and simple manufacture.

13 Claims, 4 Drawing Sheets

FASTENING STRUCTURE FOR INTEGRATED CIRCUIT AND ELECTRICAL CONNECTOR USING SAME

BACKGROUND OF THE INVENTION

1. Field of the Invention

The present invention relates to a fastening structure for fastening an integrated circuit (IC) and an electrical connector using the fastening structure.

2. Background of the invention

A conventional electrical connector, referring to U.S. Pat. No. 6,971,902, is used for connecting an IC package to a circuit board. The electrical connector includes an insulative housing embedded with a plurality of conductive contacts, a load plate and a stiffener plate movably connected with each other, and a handle used for fixing the load plate with the stiffener plate. The IC package is placed on the insulative housing and the load plate is rotated to press on the IC package. Then, the handle is rotated to make a pressing part of the handle press on the load plate, and an operating part of the handle is fastened to a tongue part of the load plate. Thereby, the IC package is firmly fastened to the electrical connector.

However, there are some inadequacies in the electrical connector: firstly, when the handle is rotated to make the load plate press on the IC package, the IC package is easily warped and the electrical connector is easily damaged and cannot work normally. Secondly, the manufacture of the load plate is very complicated and it is too much of an expense to manufacture the load plate.

An electrical connector disclosed in U.S. Pat. No. 7,147,483 for attaching an IC package to a circuit board includes an insulative housing embedded with a plurality of conductive contacts, a stiffener fixed on the circuit board and seated around the insulative housing, a U-shaped first pressing rod and a U-shaped second pressing rod pivoted to two ends of the stiffener, respectively. The first pressing rod and the second pressing rod each define a bent central section that is adapted to abut against one end of the IC package. The first pressing rod defines an extension extending laterally from the free end thereof, and the second pressing rod defines a rod portion for engaging with the extension of the first pressing rod and the end of the rod portion can be pivoted to the stiffener. In use, the stiffener is fixed on the circuit board, and then the IC package is assembled on the housing, the first pressing rod is rotated to a horizontal position where the bent central section of the first pressing portion presses one end of the IC package. The second pressing portion is rotated to engage with opposite end of the stiffener. Then, the bent central sections of the first and the second pressing rod press two ends of the IC package and the rod portion of the second pressing rod presses the extension of the first pressing rod, therefore, the IC package is mounted in the electrical connector. Because the bent central sections of the first pressing rod and the second pressing rod press two ends of the IC package, the contacting area between the electrical connector and the IC package is small and the rate that the IC package is damaged gets smaller. Further, this structural electrical connector has a simple structure and is easy to manufacture.

There is still a room for perfection for the electrical connector disclosed in U.S. Pat. No. 7,147,483: the first pressing rod engages with the second pressing rod near the middle position of the housing, it will add the height of the whole electrical connector and it goes against the development trend of the electrical connector. Furthermore, the first pressing rod and the second pressing just press two ends of the IC package, the IC package con not be assembled firmly in the electrical connector.

In view of the above, a new electrical connector which enables to overcome the above-mentioned disadvantages is desired.

SUMMARY

Therefore, a need exists for a fastening structure for fastening an IC package and an electrical connector using the fastening structure. The electrical connector enables lower cost and to effectively prevent the IC package from being warped.

The fastening structure of the present invention is used for fixing an IC package to a circuit board. A fastening structure, for fixing an IC package to a circuit board, the fastening structure comprises a retention frame comprising first and second opposite sides, a load frame comprising first and second elongate members interconnected by a third elongate member, and pivoted to the first end of the retention frame, the load frame extending substantially through the length of the retention frame, a load lever pivotally coupled to the second side of the retention frame wherein the load frame can be positioned in a first position in which the load frame is away from the load lever, and a second position, in which the third member of the load frame is pushed toward the retention frame by the load lever. An electrical connector using the fastening structure is used for connecting an IC package to a circuit board. The electrical connector comprises a retention frame comprising first and second opposite sides, a load frame comprising first and second elongate members interconnected by a third elongate member, and pivoted to the first end of the retention frame, the load frame extending substantially through the length of the retention frame, a load lever pivotally coupled to the second side of the retention frame wherein the load frame can be positioned in a first position in which the load frame is away from the load lever, and a second position, in which the third member of the load frame is pushed toward the retention frame by the load lever, an insulative housing with a plurality of contacts assembled therein and partially sitting onto the retention frame for receiving the IC package, an IC package assembled on the insulative housing, the first and the second elongate members of the load frame each compliantly and substantially press against a longitudinal side portion of the IC package.

Compared with the conventional electrical connector, the present invention using the fastening structure enables lower cost and simple manufacture. At the same time, the connection between the IC package and the circuit board is ensured and the IC package can be mounted in the electrical connector firmly. Further more, most of the top surface of the IC package is communicated with exterior space so that the electrical connector has a good capability of heat dissipating.

The present invention will be well understood when read injunction with the following drawing, in which:

DETAILED DESCRIPTION OF THE PREFERRED EMBODIMENT OF THE INVENTION

The invention will now be described in greater detail with reference to the figures.

Figure 1:
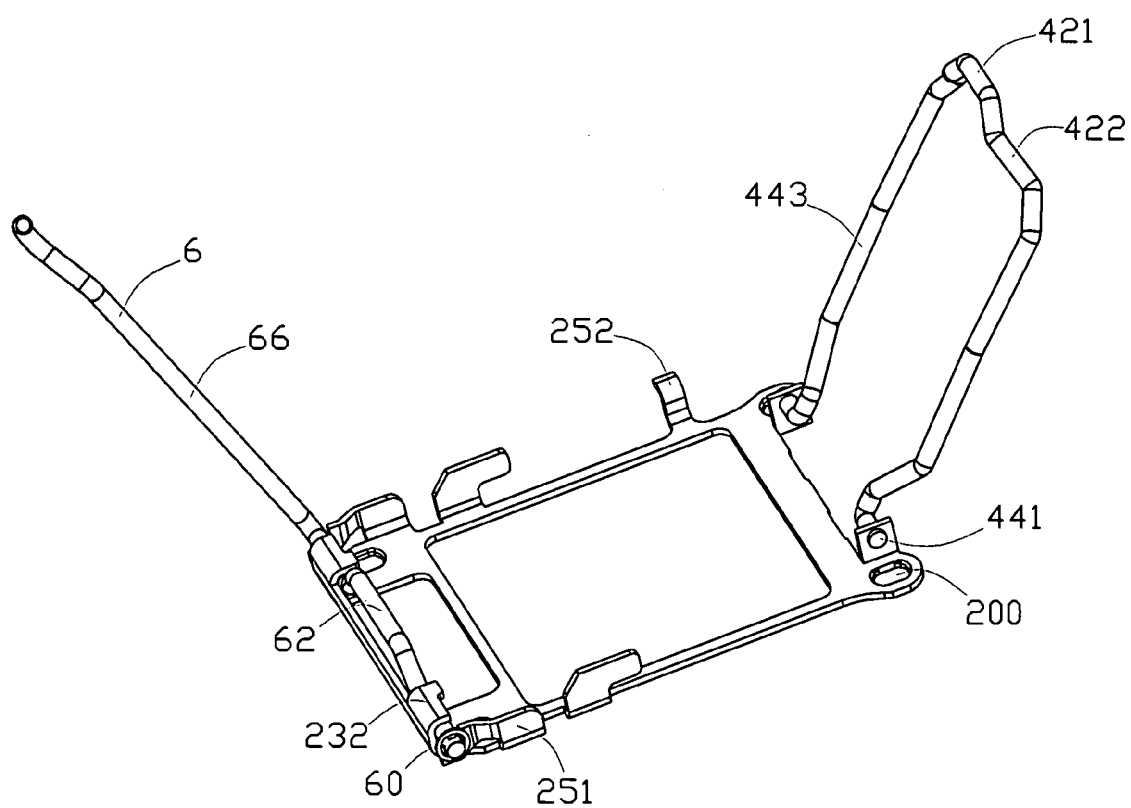
FIG. 1 is an exploded, isometric view of an fastening structure in accordance with the preferred embodiment of the present invention.
Figure 2:
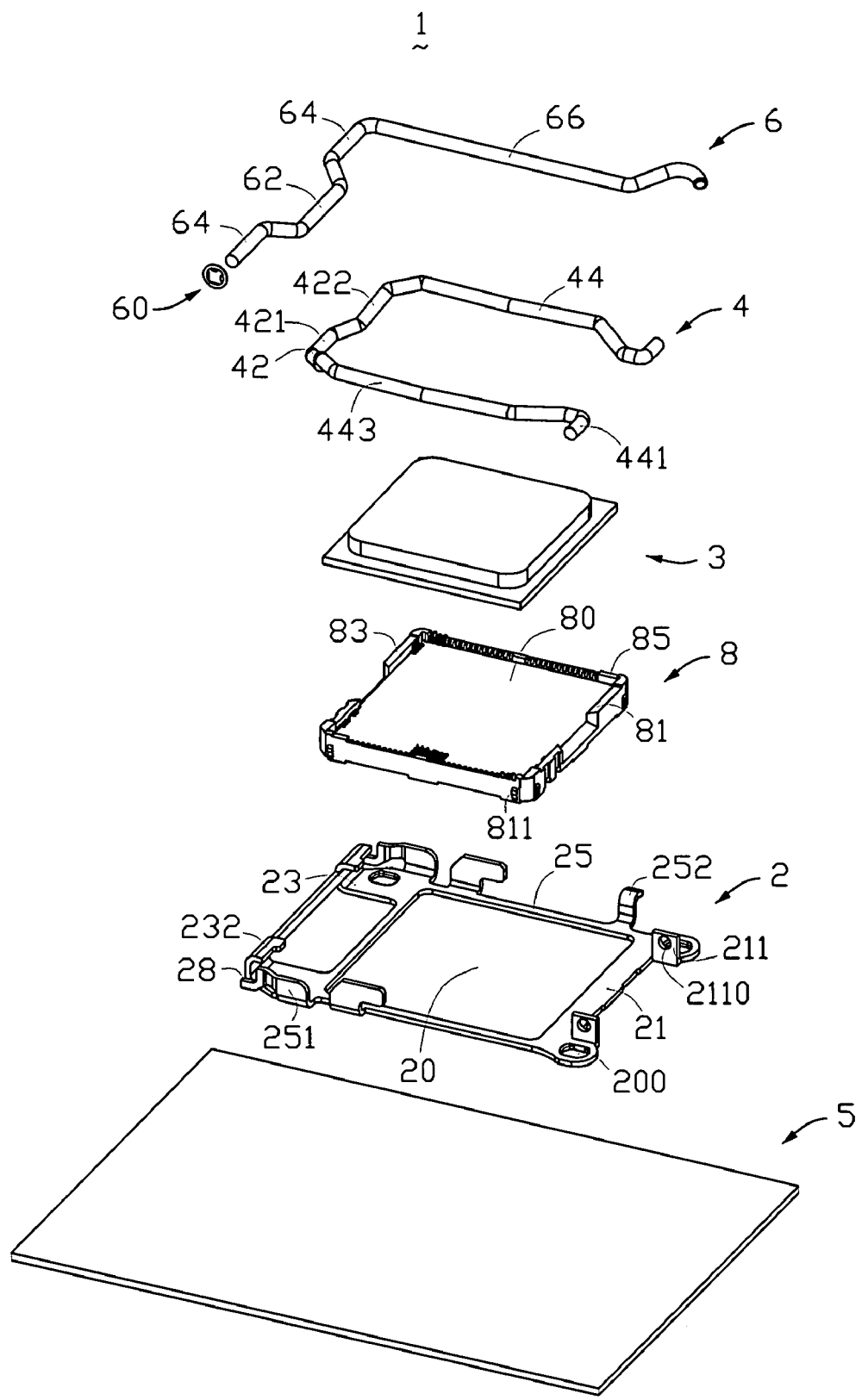
FIG. 2 is an exploded, isometric view of an electrical connector using the fastening structure of FIG. 1.
Figure 3:
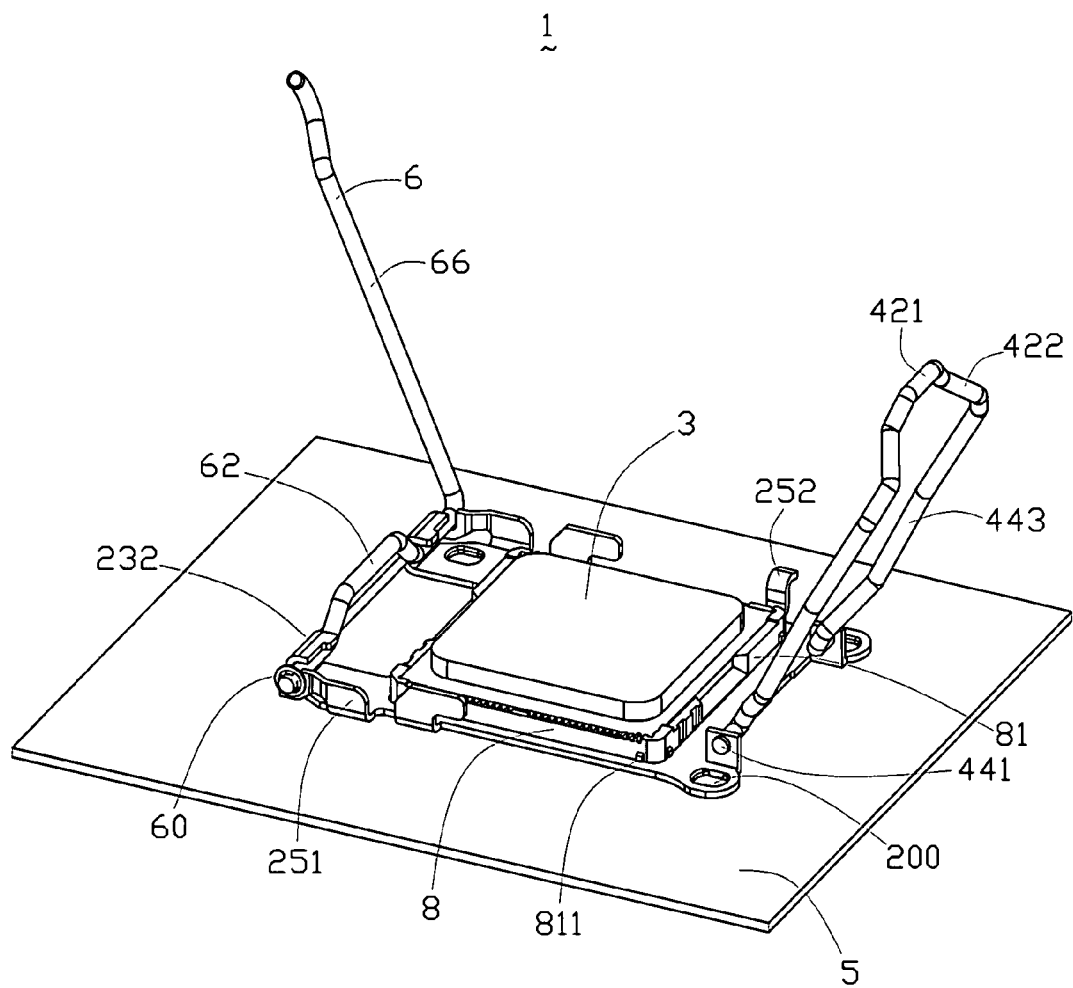
FIG. 3 is an assembled view of FIG. 2, the load frame and the load lever at unlatching status.
Figure 4:
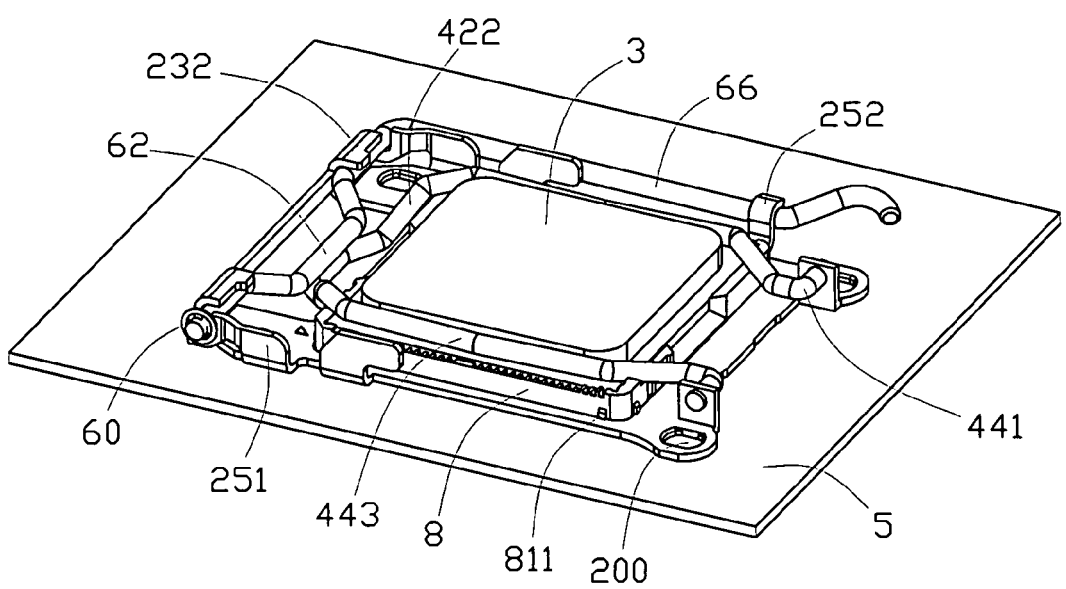
FIG. 4 is an assembled view of FIG. 2, the load frame and the load lever at latching status.

Referring to FIGS. 1-4, The present invention provides a fastening structure and an electrical connector using the fastening structure. The electrical connector 1, used for attaching an IC package 3 to a circuit board 5, comprises an insulative housing 8 embedded with a plurality of conductive contacts (not shown), and a fastening structure 9. The fastening structure 9 comprises a retention frame 2, a load frame 4 and a load lever 6 pivotally coupled to the retention frame 2.

The insulative housing 8 is fabricated from a dielectric material and includes an array of receiving holes (not shown) that hold an array of individual conductive contacts. At least one end of the conductive contacts is higher than the receiving hole and is bent to form a plurality of contacting points (not shown) The lower end of the conductive contact is electrically connected with the circuit board 5. The insulative housing 8 is substantially rectangular in shape, although other geometric forms and shapes may be employed in alternative embodiments. The insulative housing 8 includes front and back interior walls 81 and 83, and interior side walls 85 adjacent to the front and back interior walls 81 and 83. The front and back walls 81, 83, and side walls 85 form a recess 80 within which an IC package 3 is received. The front and back interior wall 81 and 83 each defines a groove 810 for taking off the IC package 3 from the insulative housing 8 conveniently. The exterior surface of the walls 81, 83 and 85 defines a plurality of protrusions 811.

The retention frame 2 includes a first side 21, a second side 23, and opposed side rails 25. Each of the side rails 25 joins the front and second sides 21 and 23 to form a substantially rectangular enclosure 20 wherein the first side 21 is adjacent the front interior wall 81, the second side 23 is adjacent the back interior wall 83, and each side rail 25 is adjacent an interior side wall 85. The first side 21 and the second side 23 define a plurality of position holes 200. The retention frame 2 attaches to circuit board 5 via fixture (not shown) engaging in the position holes 200 and mounting holes (not shown) of the circuit board 5. A pair of rolled over C-shaped retaining portion 232 extends from the second side 23. Two holding walls 211 extend upwardly from the two ends of the first side 21 and each holding wall 211 defines a aperture 2110. The forward end 251 of each side rails 25 defines a bearing surface 28. An interlocking portion 252 extends from one of the side rails. The insulative housing 8 locates in the retention frame 2 by interferential engagement between the protrusions 811 and the sides 21, 23 and 25.

The load lever 6 is rotatably coupled to the second side 23 of the retention frame 2 and includes a latching section 62 that is positioned between a pair of shaft portion 64. The shaft portion 64 is received in the rolled over C-shaped retaining portion 232 and is mounting on the bearing surface 28. The load lever 6 defines an operating portion 66 that is roughly vertical to the shaft portion 64 and is locked to the interlocking section 251 of the retention frame 2. The electrical connector 1 further comprises a ring 60 assembled in one end of the load lever 6 for controlling the rotation of the load lever 6.

The load frame 4 is made of wire via several bends and has an approximately Π-shaped configuration. The load frame 4 includes a pair of elongate members 44 interconnected by a third elongate member 42. The third elongate member 42 comprises a load point 421 that is engaged by the latching section 62 to hold the load frame 4 in a closed position in which the third elongate member 42 of the load frame 4 is pushed toward the retention frame 2 by the load lever 6 and an open positioned in which the load frame 4 is away from the load lever 6 between two connection sections 422. Each of the elongate members 44 has a L-shaped configuration and includes a pressing portion 443 compliantly and substantially pressing against a longitudinal side of the IC package 3 and a hinge tab 441 pressing against one end of the IC package 3. The free end of the hinge tab 441 is received in the aperture 2210 of the holding wall 221 for allowing rotation of load frame 4 with respect to the retention frame 2. The load point 421 and the latching section 62 have a flat configuration.

In assembly, the insulative housing 8 is located in the retention frame 2, the load lever 6 and the load frame 4 are coupled to two ends of the retention frame 2 by the shaft portion 64 and the hinge tab 441, respectively. The electrical connector 1 is mounted on the circuit board 5 and the lower end of the conductive contact is electrically connected the circuit board 5. The IC package 3 is received in the recess 80 and connects with the upper end of the conductive contact. When the load frame 4 is rotated to a horizontal position, the third elongate member 42 and two elongate members 44 both press on the IC package 3. The load lever 6 is rotated till the operating portion 66 is locked to the interlocking section 252. So the IC package 3 is electrically connected with the circuit board 5 firmly via the conductive contacts. The present fastening structure 9 and the electrical connector 1 using the fastening structure 9 adopts the load frame 4 to fix IC package 3 so that the cost is lower, the manufacture is simplified and it can prevent the IC package damaging effectively. Comprised with the electrical connector disclosed in U.S. Pat. No. 7,147,483, the electrical connector 1 of present invention defines two side elongate members 44 which compliantly and substantially press against a longitudinal portion of the IC package 3 and this makes the IC package 3 mount in the electrical connector more firmly.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A fastening structure, for fixing space an space IC package to a circuit board, the fastening structure comprising:
  a retention frame comprising first and second opposite sides and each including a socket hinge extending upward from an end thereof;
  a load frame configured with wire and having an U-shaped configuration and comprising first and second elongate members interconnected by a third elongate member, and the first and second elongate members each including a free end pivotally coupled to socket hinge located at the first side of the retention frame, the load frame extending substantially through the length of the retention frame;

a load lever pivotally coupled to the second side of the retention frame wherein the load frame can be positioned in an open position in which the load frame is away from the load lever, and a close position, in which the third member of the load frame is pushed toward the retention frame by the load level; wherein the third elongate member of the load frame defines a load point, and the load lever defines a locking portion for securely engaging with the load point of the third elongate member of the load frame.

2. The fastening structure as claimed in claim 1, wherein the fastening structure further comprises a ring assembled in the load lever for controlling the rotation of the load lever.

3. The fastening structure as recited in claim 1, wherein the free end of the first and second elongated members is coupled to the socket hinge from an inner side of the socket hinge.

4. The fastening structure as claimed in claim 1, wherein each of the first and second elongate members has a L-shaped configuration and defines a pressing portion for pressing against the IC package and a hinge tab coupled to the retention frame.

5. The fastening structure as claimed in claim 4, wherein two holding walls extend upwardly from the first side of the retention frame and define two apertures for receiving the hinge tabs of the first and second elongate members.

6. An electrical connector for attaching an IC package to a circuit board comprising:

a retention frame comprising first and second opposite sides, and each including a socket hinge extending upward therefrom;

a load frame configured with wire and comprising first and second elongate members interconnected by a third elongate member, and the first and second elongate members each including a free end pivotally coupled to socket hinge of the first end of the retention frame, the load frame extending substantially through the length of the retention frame;

a load lever pivotally coupled to the second side of the retention frame wherein the load frame can be positioned in a first position in which the load frame is away from the load lever, and a second position, in which the third member of the load frame is pushed toward the retention frame by the load lever;

an insulative housing with a plurality of contacts assembled therein and partially sitting onto the retention frame for receiving the IC package;

an IC package assembled on the insulative housing, the first and the second elongate members of the load frame each compliantly and substantially press against a longitudinal side portion of the IC package; wherein the third elongate member of the load frame defines a load point, and the load lever defines a locking portion for securely engaging with the load point of the third elongate member of the load frame.

7. The electrical connector as claimed in claim 6, wherein the fastening structure further comprises a ring assembled in the load lever for controlling the rotation of the load lever.

8. The electrical connector as claimed in claim 6, wherein each of the first and second elongate members has a L-shaped configuration and defines a pressing portion for pressing on the IC package and a hinge tab coupled to the retention frame.

9. The electrical connector as claimed in claim 8, wherein two holding walls extend upwardly from the first side of the retention frame and define two apertures for receiving the hinge tabs of the first and second elongate members.

10. An electrical connector assembly comprising:

an retention frame defining two opposite ends along a lengthwise direction;

an insulative housing surrounded by said retention frame;

a plurality of contacts disposed in the housing;

an IC package disposed upon the housing and defining two opposite sides along a transverse direction perpendicular to said lengthwise direction;

a wire-like load frame rotationally mounted on one end of the retention frame; and a load lever rotationally mounted on the other end of the retention frame and capable of pressing against a portion of said load frame away from said end; wherein said load frame extends along most portions of a peripheral region of said IC package and presses against said two opposite sides of the IC package when the load frame is pressed down by the load lever; and the load frame is mainly of an U-shaped configuration extending substantially through a whole length of the retention frame in said lengthwise direction to have two side arms of the U-shaped configuration press against the two opposite lateral sides of the IC package, while the load lever does not directly press against the IC package but only against a connection arm of the load frame which connects said two side arms of the U-shaved configuration.

11. The electrical connector assembly as claimed in claim 10, wherein said wire-like load frame keeps mostly a constant cross-sectional along a whole length thereof.

12. The electrical connector assembly as claimed in claim 10, further including a printed circuit board on which the retention frame is fastened thereon.

13. The electrical connector assembly as claimed in claim 10, wherein at least one of said load frame and said load lever is pivotally mounted to the retention frame.

* * * * *